(12) United States Patent
Kumar et al.

(10) Patent No.: US 10,388,400 B2
(45) Date of Patent: Aug. 20, 2019

(54) GENERALIZED PRODUCT CODES FOR FLASH STORAGE

(71) Applicant: SK hynix Inc., Gyeonggi-do (KR)

(72) Inventors: Naveen Kumar, San Jose, CA (US); Aman Bhatia, San Jose, CA (US); Lingqi Zeng, San Jose, CA (US)

(73) Assignee: SK hynix Inc., Gyeonggi-do (KR)

(*) Notice: Subject to any disclaimer, the term of this patent is extended or adjusted under 35 U.S.C. 154(b) by 167 days.

(21) Appl. No.: 15/158,425

(22) Filed: May 18, 2016

(65) Prior Publication Data

US 2016/0342467 A1    Nov. 24, 2016

Related U.S. Application Data

(60) Provisional application No. 62/163,291, filed on May 18, 2015.

(51) Int. Cl.

| | |
|---|---|
| *G11C 29/00* | (2006.01) |
| *G11C 29/52* | (2006.01) |
| *G06F 11/10* | (2006.01) |
| *G11C 16/34* | (2006.01) |
| *G11C 29/42* | (2006.01) |
| *G11C 29/04* | (2006.01) |

(52) U.S. Cl.
CPC .......... *G11C 29/52* (2013.01); *G06F 11/108* (2013.01); *G06F 11/1068* (2013.01); *G06F 11/1088* (2013.01); *G06F 11/1096* (2013.01); *G11C 16/349* (2013.01); *G11C 29/42* (2013.01); *G06F 2211/109* (2013.01); *G11C 2029/0409* (2013.01); *G11C 2029/0411* (2013.01)

(58) Field of Classification Search
CPC ....... G11C 29/52; G11C 16/349; G11C 29/42; G11C 2029/0409; G11C 2029/0411; G06F 11/108; G06F 11/1088; G06F 11/1096; G06F 2211/109; G06F 11/1068; G06F 3/0619; G06F 3/065; G06F 3/067; G06F 3/0688
USPC ....... 714/701, 746, 751, 752, 757, 758, 763, 714/767, 800, 804
See application file for complete search history.

(56) References Cited

U.S. PATENT DOCUMENTS

| | | | |
|---|---|---|---|
| 4,617,664 A | * | 10/1986 | Aichelmann, Jr. .......................... G06F 11/1028 714/758 |
| 5,477,551 A | * | 12/1995 | Parks .................. G06F 11/1044 714/757 |
| 5,517,514 A | * | 5/1996 | Norrie ..................... G06F 11/10 714/800 |
| 6,052,815 A | | 4/2000 | Zook |
| 7,356,752 B2 | | 4/2008 | Hewitt et al. |

(Continued)

OTHER PUBLICATIONS

J. Justesen, "Performance of product codes and related structures with iterated decoding," IEEE Transactions on Communications, Feb. 2011, pp. 407-415, vol. 59, No. 2, IEEE.

(Continued)

*Primary Examiner* — Christine T. Tu
(74) *Attorney, Agent, or Firm* — IP & T Group LLP

(57) ABSTRACT

Memory systems may include an encoder suitable for arranging data in rows of data blocks as a plurality of codewords, and permuting the data block rows and constructing row parities on the permuted rows, and a decoder suitable for decoding the codewords, and correcting stuck error patterns when decoding of the codewords fails.

18 Claims, 10 Drawing Sheets

(56) References Cited

U.S. PATENT DOCUMENTS

| | | |
|---|---|---|
| 8,156,400 B1 | 4/2012 | Yeo et al. |
| 8,429,498 B1 | 4/2013 | Anholt et al. |
| 8,468,430 B2 | 6/2013 | Shin et al. |
| 8,887,020 B2 | 11/2014 | Shokrollahi |
| 9,231,623 B1 | 1/2016 | Kumar et al. |
| 9,559,727 B1 | 1/2017 | Kumar et al. |
| 9,998,148 B2 | 6/2018 | Lin et al. |
| 2004/0025106 A1 | 2/2004 | Massey |
| 2004/0054651 A1 | 3/2004 | Katayama et al. |
| 2008/0134004 A1 | 6/2008 | Park et al. |
| 2010/0088575 A1 | 4/2010 | Sharon et al. |
| 2010/0199149 A1 | 8/2010 | Weingarten et al. |
| 2011/0258514 A1 | 10/2011 | Lasser |
| 2012/0317460 A1 | 12/2012 | Chilappagari et al. |
| 2014/0095960 A1 | 4/2014 | Chu et al. |
| 2014/0129896 A1 | 5/2014 | Parthasarathy et al. |
| 2014/0129899 A1 | 5/2014 | Kumar et al. |
| 2015/0309869 A1 | 10/2015 | Mitterholzer et al. |
| 2015/0309875 A1 | 10/2015 | Mittelholzer et al. |
| 2016/0142075 A1 | 5/2016 | Maehata |
| 2016/0285478 A1 | 9/2016 | Fujiwara |
| 2016/0342467 A1 | 11/2016 | Kumar et al. |
| 2017/0222662 A1 | 8/2017 | Kumar et al. |
| 2017/0257121 A1* | 9/2017 | Kwok ................. G06F 11/1076 |
| 2017/0279468 A1 | 9/2017 | Kumar et al. |
| 2017/0331500 A1 | 11/2017 | Bhatia et al. |
| 2017/0373706 A1 | 12/2017 | Lin et al. |

OTHER PUBLICATIONS

F. Therattil and A. Thangaraj, "A low-complexity soft-decision decoder for extended BCH and RS-like codes," in Proc. IEEE Int. Symp. Inf. Theory, Sep. 2005, pp. 1320-1324.

Jorn Justesen, "Performance of Product Codes and Related Structures with Iterated Decoding", IEEE Transactions on Communications, vol. 59, No. 2, Feb. 2011, pp. 407-415.

Sklar, et al. "The ABCs of Linear block codes" IEEE Signal Processing Magazine, vol. 21, Issue 4, Jul. 19, 2004, pp. 14-35.

* cited by examiner

1400

GENERALIZED PRODUCT CODES FOR FLASH STORAGE

CROSS-REFERENCE TO RELATED APPLICATIONS

This application claims the benefit of U.S. Provisional Application No. 62/163,291 filed May 18, 2015, the entire contents of which are incorporated herein by reference.

BACKGROUND

1. Field

Exemplary embodiments of the present disclosure relate to a memory system and an operating method thereof.

2. Description of the Related Art

The computer environment paradigm has shifted to ubiquitous computing systems that can be used anytime and anywhere. Due to this fact, the use of portable electronic devices such as mobile phones, digital cameras, and notebook computers has rapidly increased. These portable electronic devices generally use a memory system having memory devices, that is, a data storage device. The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

As industry demands increase, performance and quality of memory devices and systems is required. Thus, there exists a need for memory devices with improved performance and quality.

SUMMARY

Aspects of the invention include memory systems. The memory systems may include an encoder suitable for arranging data in rows of data blocks as a plurality of codewords, and permuting the data block rows and constructing row parities on the permuted rows, and a decoder suitable for decoding the codewords, and correcting stuck error patterns when decoding of the codewords fails.

Further aspects of the invention include methods. The methods may include arranging, with an encoder, data in rows of data blocks as a plurality of codewords permuting, with the encoder, the data block rows and constructing row parities on the permuted rows, decoding, with a decoder, the codewords, and correcting, with the decoder, stuck error patterns when decoding of the codewords fails.

Additional aspects of the invention include memory devices. The memory devices may include an encoder configured to arrange data in rows of data blocks as a plurality of codewords, and permute the data block rows and construct row parities on the permuted rows, and a decoder configured to decode the codewords, and correct stuck error patterns when decoding of the codewords fails.

DETAILED DESCRIPTION

Figure 1:
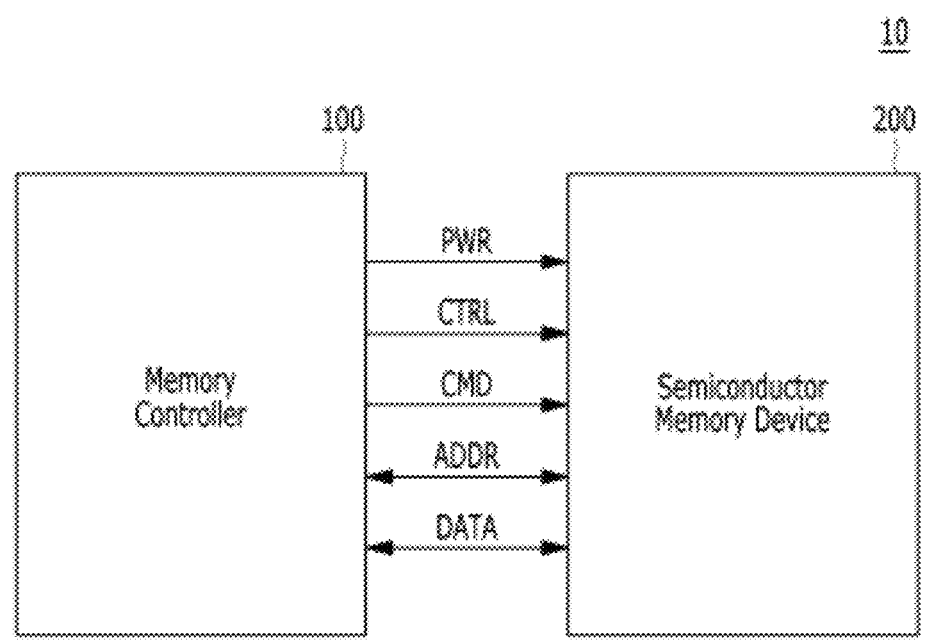
FIG. 1 is a block diagram schematically illustrating a memory system in accordance with an embodiment of the present invention.

Various embodiments will be described below in more detail with reference to the accompanying drawings. The present invention may, however be embodied in different forms and should not be construed as limited to the embodiments set forth herein. Rather these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

FIG. 1 is a block diagram schematically illustrating a memory system 10 in accordance with an embodiment of the present invention.

Referring FIG. 1, the memory system 10 may include a memory controller 100 and a semiconductor memory device 200.

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal may include a command latch enable (CLE) signal an address latch enable (ALE) signal, a chip enable (CE) signal, a write enable (WE) signal, a read enable (RE) signal, and so on.

The memory controller 100 and the semiconductor memory device 200 may be integrated in a single semiconductor device. For example, the memory controller 100 and the semiconductor memory device 200 may be integrated in a single semiconductor device such as a solid state drive (SSD). The solid state drive may include a storage device for storing data therein. When the semiconductors memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the memory system 10 may be provided as one of various elements including an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, a radio-frequency identification (RFID) device, or elements devices of a computing system.

Figure 2:
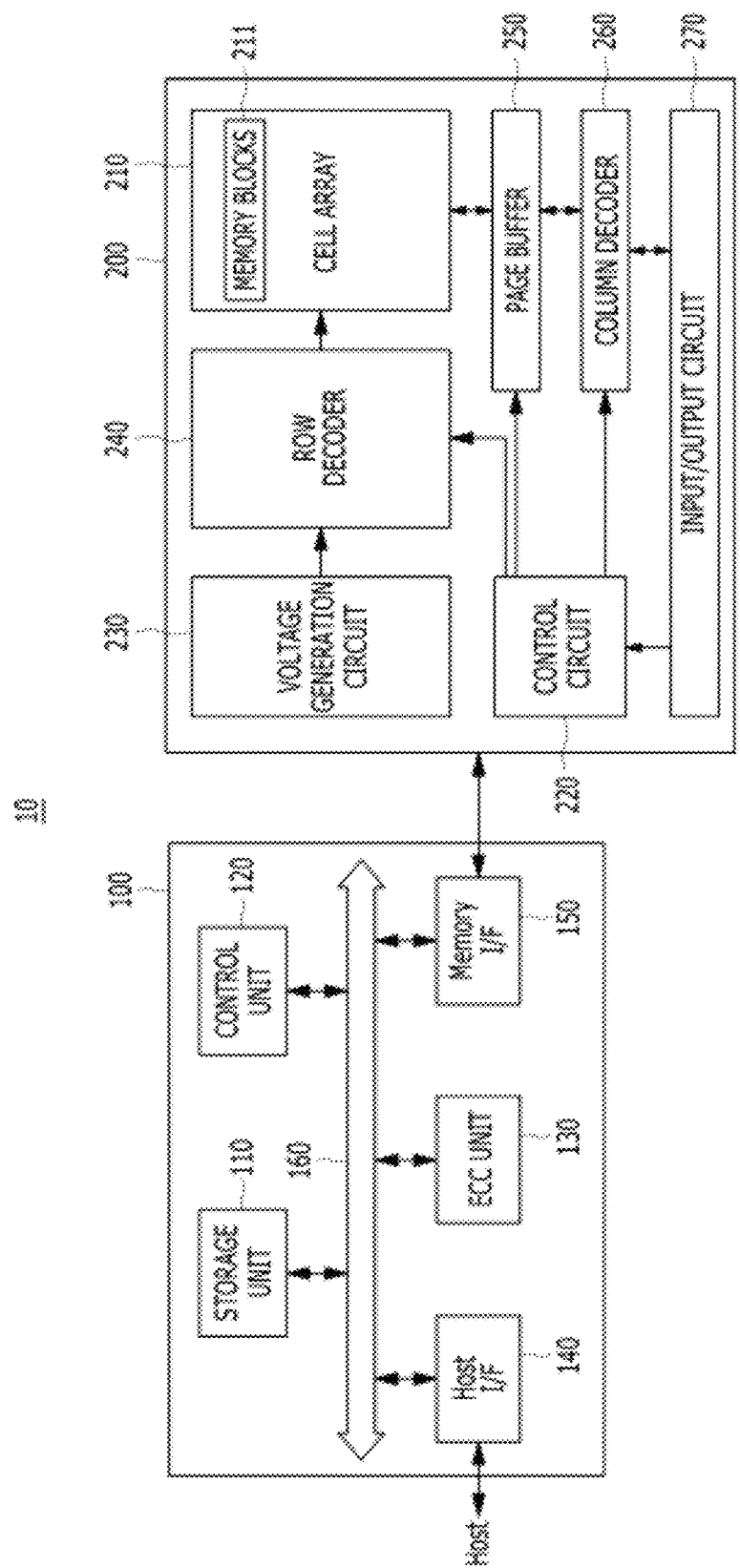
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device, and in particular store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, a digital video recorder and a digital video player. In some embodiments, the host device may include a portable electronic device such as a mobile phone, a smart phone, an e-book, an MP3 player, a portable multimedia player (PMP), and a portable game player.

The memory device 200 may store data to be accessed by the host device.

The memory device 200 may be implemented with a volatile memory device such as a dynamic random access memory (DRAM) and a static random access memory (SRAM) or a non-volatile memory device such as a read only memory (ROM), a mask ROM (MROM) a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (PRAM).

The controller 100 may control storage of data in the memory device 200. For example, the controller 100 may control the memory device 200 in response to a request from the host device. The controller 100 may provide the data read from the memory device 200, to the host device, and store the data provided from the host device into the memory device 200.

The controller 100 may include a storage unit 110, a control unit 120, the error correction code (ECC) unit 130, a host interface 140 and a memory interface 150, which are coupled through a bus 160.

The storage unit 110 may serve as a working memory of the memory system 10 and the controller 100, and store data for driving the memory system 10 and the controller 100. When the controller 100 controls operations of the memory device 200, the storage unit 110 may store data used by the controller 100 and the memory device 200 for such operations as read, write, program and erase operations.

The storage unit 110 may be implemented with a volatile memory. The storage unit 110 may be implemented with a static random access memory (SRAM) or a dynamic random access memory (DRAM). As described above, the storage unit 110 may store data used by the host device in the memory device 200 for the read and write operations. To store the data, the storage unit 110 may include a program memory, a data memory, a write buffer, read buffer, map buffer, and so forth.

The control unit 120 may control general operations of the memory system 10, and a write operation or a read operation for the memory device 200, in response to a write request or a read request from the host device. The control unit 120 may drive firmware, which is referred to as a flash translation layer (FTL), to control the general operations of the memory system 10. For example, the FTL may perform operations such as logical to physical (L2P) mapping, wear leveling, garbage collection, and bad block handling. The L2P mapping is known as logical block addressing (LBA).

The ECC unit 130 may detect and correct errors in the data read from the memory device 200 during the read operation. The ECC unit 130 may not correct error bits when the number of the error bits is greater than or equal to a threshold number of correctable error bits, and may output an error correction fail signal indicating failure in correcting the error bits.

In some embodiments, the ECC unit 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a Block coded modulation (BCM), and so on. The ECC unit 130 may include all circuits, systems or devices for the error correction operation.

The host interface 140 may communicate with the host device through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, a column decoder 260, and an input/output circuit 270. The memory cell array 210 may include a plurality of memory blocks 211 and may store data therein. The voltage generation circuit 230, the row decoder 240, the page buffer 250, the column decoder 260 and the input/output circuit 270 form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages having various levels. For example in an erase operation, the voltage generation circuit 230 may generate operation voltages having various levels such as an erase voltage and a pass voltage.

The row decoder 240 may be connected to the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks among the plurality of memory blocks 211.

The page buffer 250 is connected to the memory cell array 210 through bit lines BL (not shown). The page buffer 250 may precharge the bit lines BL with a positive voltage, transmit/receive data to/from a selected memory block in program and read operations, or temporarily store transmitted data, in response to a page buffer control signal generated by the control circuit 220.

The column decoder 260 may transmit/receive data to/from the page buffer 250 or transmit/receive data to/from the input/output circuit 270.

The input/output circuit 270 may transmit, to the control circuit 220, a command and an address, transmitted from an external device (e.g., the memory controller 100) transmit data from the external device to the column decoder 260, or output data from the column decoder 260 to the external device, through the input/output circuit 270.

The control circuit 220 may control the peripheral circuit in response to the command and the address.

Figure 3:
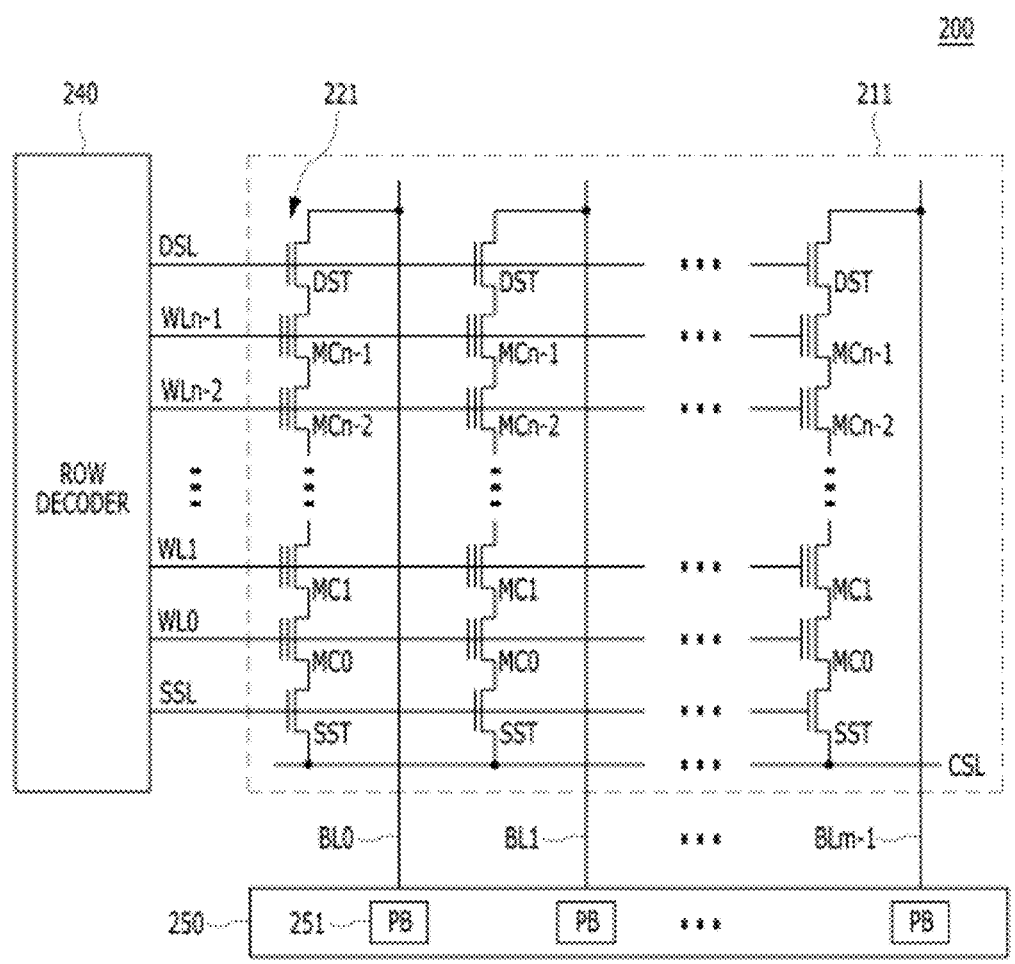
FIG. 3 is a circuit diagram illustrating a memory block of a memory device in accordance with an embodiment of the present invention.

FIG. 3 is a circuit diagram illustrating a memory block of a semiconductor memory device in accordance with an embodiment of the present invention. For example, a memory block of FIG. 3 may be the memory blocks 211 of the memory cell array 200 shown in FIG. 2.

Referring to FIG. 3, the memory blocks 211 may include a plurality of cell strings 221 coupled to bit lines BL0 to BLm−1, respectively. The cell string of each column may include one or more drain selection transistors DST and one or more source selection transistors SST. A plurality of memory cells or memory cell transistors may be serially coupled between the selection transistors DST and SST. Each of the memory cells MC0 to MCn−1 may be formed of a multi-level cell (MLC) storing data information of multiple bits in each cell. The cell strings 221 may be electrically coupled to the corresponding bit lines BL0 to BLm−1, respectively.

In some embodiments, the memory blocks 211 may include a NAND-type flash memory cell. However, the memory blocks 211 are not limited to the NAND flash memory, but may include NOR-type flash memory, hybrid flash memory in which two or more types of memory cells are combined, and one-NAND flash memory in which a controller is embedded inside a memory chip.

Figure 4:
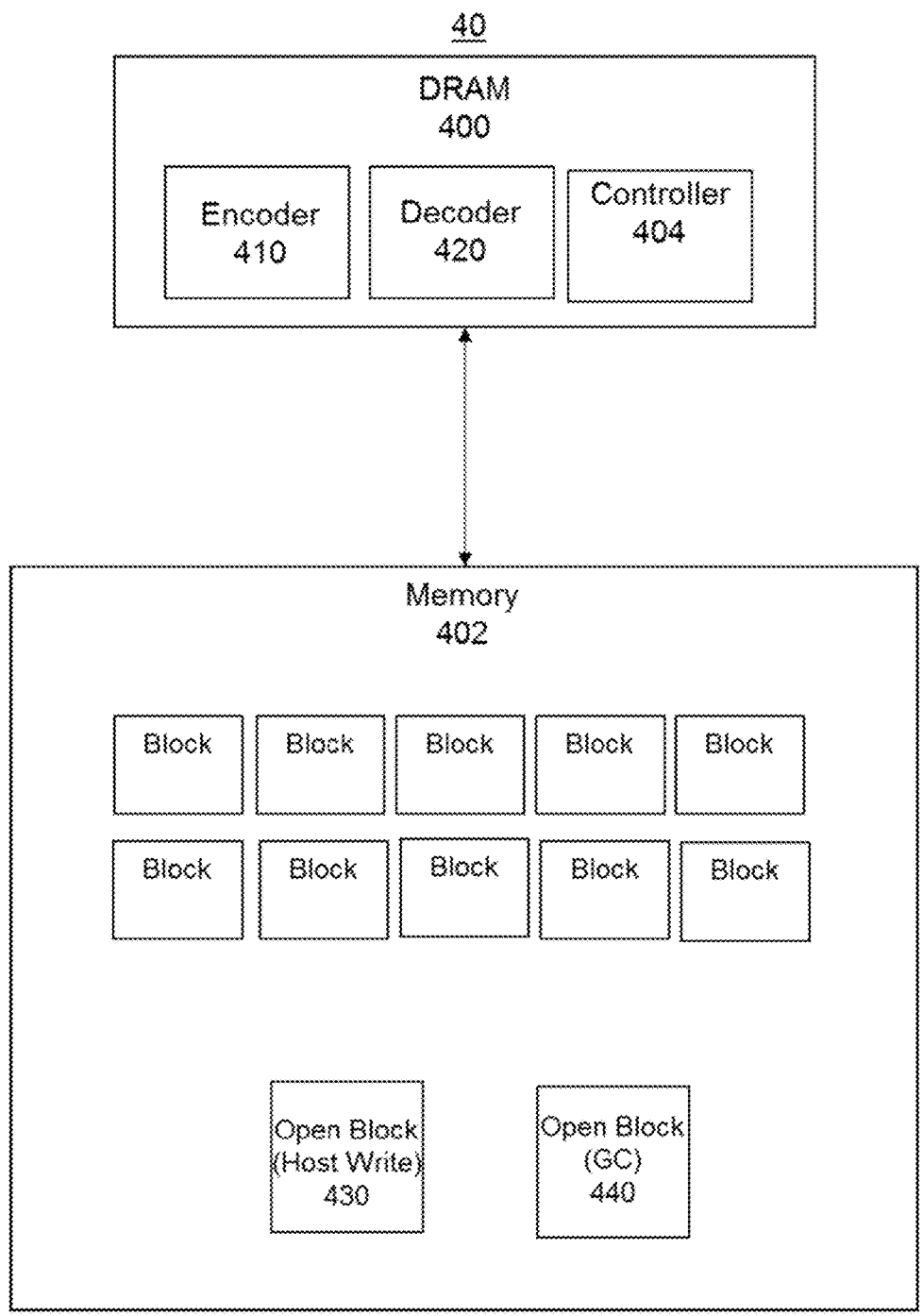
FIG. 4 is a diagram of an example system according to aspects of the invention.

At FIG. 4, an example system 40 for encoding and decoding is shown. The system 40 includes a memory 402 and a DRAM 400. The memory 402 may include a plurality of blocks (e.g., data), and open blocks for host write 430 and garbage collection 440. The DRAM 400 may include a controller 404, an encoder 410, and a decoder 420, with the DRAM 400 being in communication with the memory 402. The encoder 410 may be configured to encode data bits into codewords and perform other various functions as is described below. The decoder 420 may be configured to decode data from the encoder 410, detect miscorrection issues, detect stuck error patterns, and other functions as is described below. Although shown separate units, the encoder 410 and decoder 420 may form a single unit, may be integrated with the controller 404, and/or have other arrangement as is known to those of skill in the art.

Coding techniques based on turbo product codes (TPC) have been proposed for NAND-based storage. The codes based on. TPC provide significant performance gains compared to the state of the art coding techniques like BCH and LDPC codes. TPC have been designed for code rates which are suitable for mobile product applications. However in enterprise applications (e.g., larger system requirements), the code rates are required to be higher than mobile applications. The performance of codes is another key metric in code evaluation for enterprise applications. Thus, it is desirable to have a coding technique which can provide better performance gains compared to the state of the art techniques. The key challenge for finding better coding solutions is to reduce the error floor to the desired regime for the required code length. Random read/write operations are based on 4 KB code length in NAND-based devices. It is known that it is more challenging to remove the error floor for shorter code length codes. As disclosed herein, a construction of product codes is described that provide significant performance gains at enterprise code rates and does not suffer from the error floor problem.

Figure 5A:
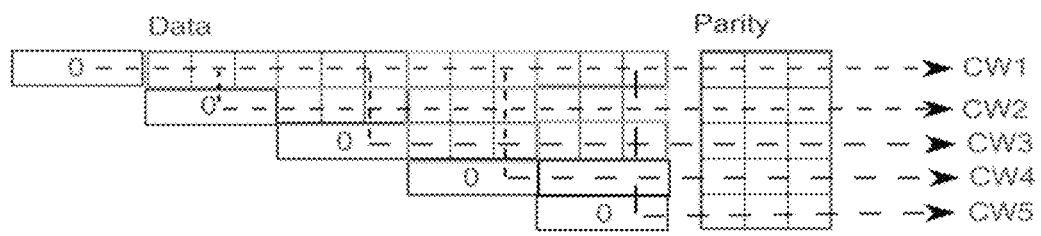
FIGS. 5A, 5B, and 5C are examples of codeword constructions according to aspects of the invention.
Figure 5B:
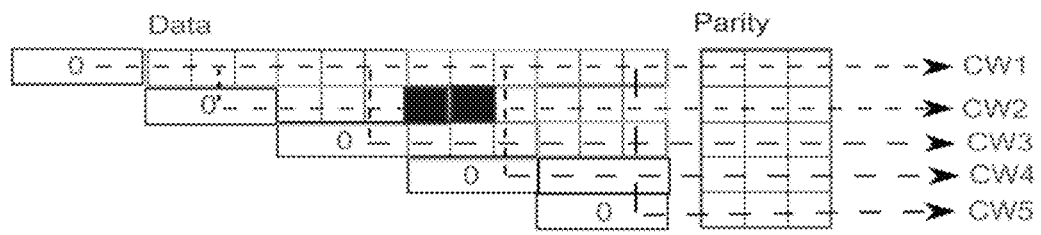
Figure 5C:
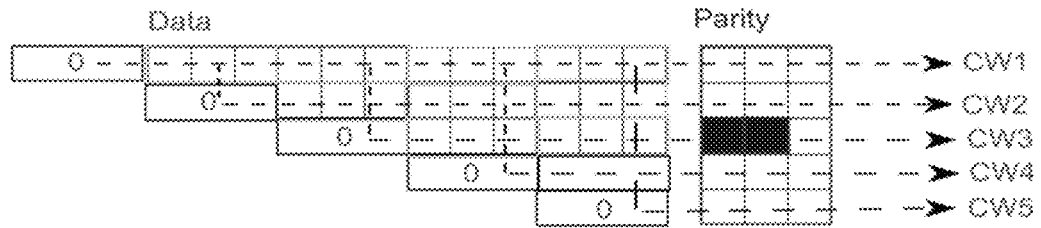

Half turbo product codes (HTPC) and block turbo product codes have been previously described. In block TPCs, the data is combined into blocks to meet code rate constraints before being arranged into a rectangular fashion. The data is arranged in a triangular fashion in HTPCs for denser connectivity between constituent codewords and better waterfall performance. In a code construction that uses both techniques, the data is first combined into blocks which are then arranged in a triangular fashion as shown in FIG. 5A. This construction has an error floor issue as explained below. In FIG. 5B, an error pattern of weight 2 is shown which will get stuck in decoding when the correction capability for the constituent codes is equal to 1. Because of the block structure, any 2 channel errors that lie in an intersection will get stuck in the decoding and this will lead to an error floor in the performance. Furthermore, any 2 channel errors in any row parity will also get stuck during decoding as shown in FIG. 5C. These stuck patterns must be removed to make this code construction useful for data storage applications.

Disclosed herein are systems, methods, and devices for addressing the above error floor issues. For this disclosure, BCH codes are used for constituent codes for illustrative purposes. Those of skill in the art will understand other codes that may be utilized in order to effectuate the invention from the disclosure herein.

Figure 6:
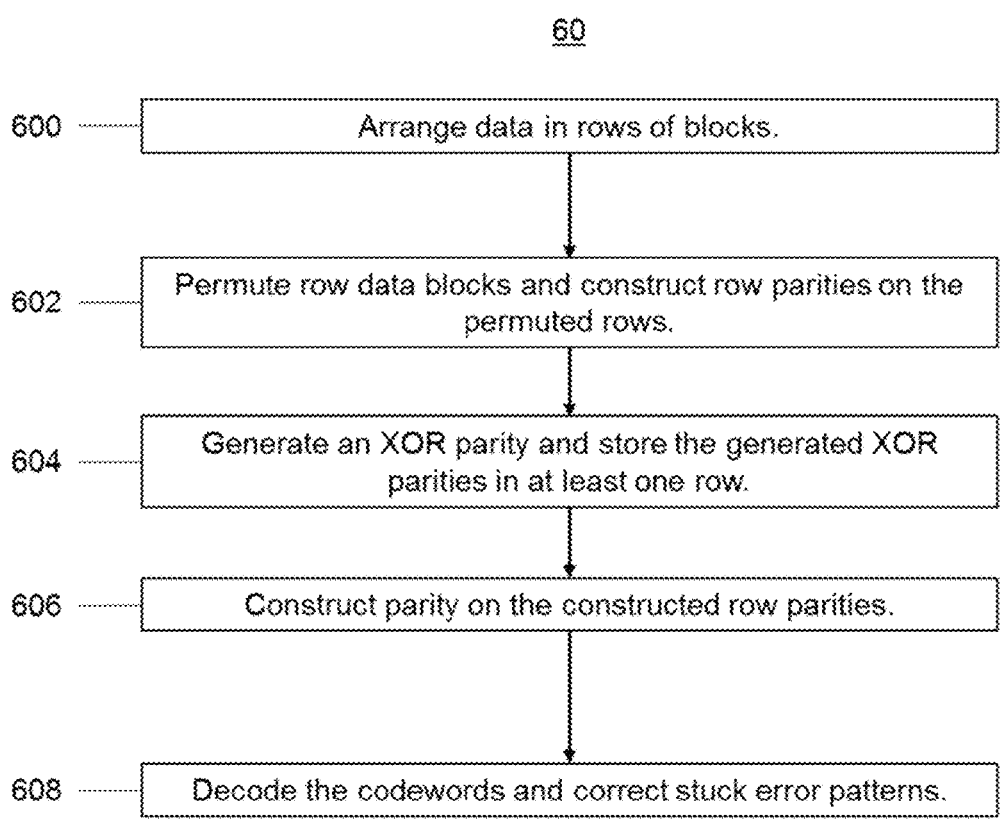
FIG. 6 is a flowchart of steps in a method for encoding and decoding in accordance with aspects of the invention.

FIG. 6 is a flowchart 60 of steps for encoding and decoding data (e.g., the steps may be performed by a decoder and/or encoder). At step 600, data is arranged in rows of blocks. At step 602, row data blocks are permuted and row parities on the permuted rows is constructed. A structure generated by steps 600 and 602 may resemble those shown in FIGS. 7 and 8, and the code is shown for generalized product codes (GPC) although other product codes may be used.

Figure 7:
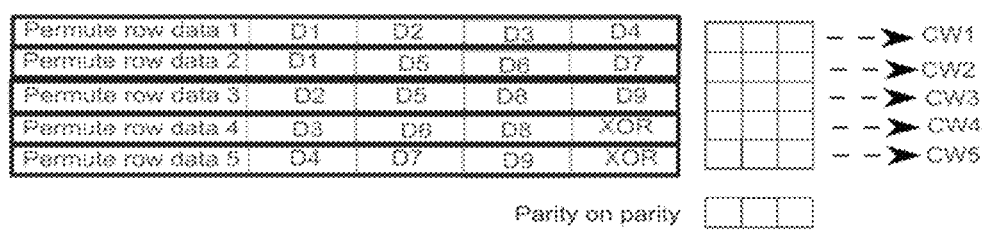
FIGS. 7, 8, 9, 10, 11, 12 and 13 are diagrams of example data arrangements, codewords and parities according to aspects of the invention.

Referring to FIG. 7, is arranged in blocks and each block $D_k$ contains I bits (e.g., each block include the same number of bits). Each row data is, then permuted and the codeword panty is constructed on the permuted data. As can be seen the row data may be permuted such that each data block is included in at least two rows.

Figure 8:
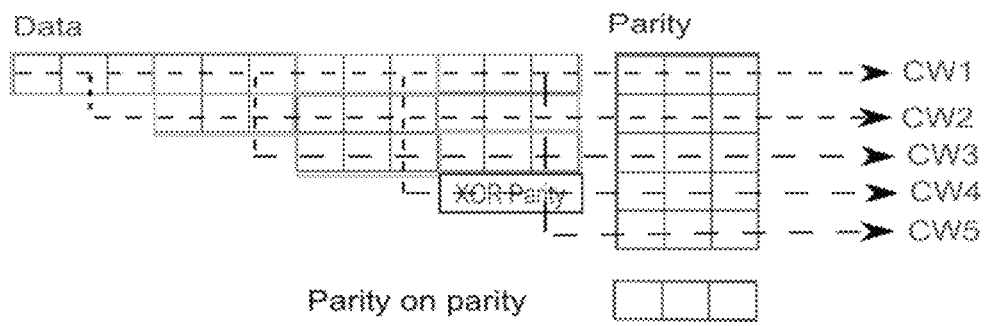

At step 604, an XOR parity is generated and is stored in at least one row. In FIG. 8, I is taken as 3, but it can be chosen any value depending upon desired data length and code rate. Let $N_{cw}$ be number of row codewords. $N_{cw}$ is equal to 5 in FIG. 8. The XOR parity may be generated by taking XOR of all data blocks of length I and the parities of the first ($N_{cw}-1$) row codewords (or other predetermined number of rows). The length of XOR parity is also equal to I. The generated XOR parity may be then stored in a row of data blocks (e.g., since the length of the XOR parity may be equal to the length of the data bits).

At step 606, a parity on the constructed parities is constructed. All row parities may be further encoded by another constituent codes which is called parity on parity. In this code construction, the decoding criterion may be such that data is decoded successfully if all $N_{cw}$ codewords are decodable and XOR parity check is satisfied.

The parities on the parity may be constructed by combining row parities column-wise. The permutation in the structure removes miscorrections because same codeword will not be formed for different rows with changing data locations with permutations. Ail the data blocks are protected twice, however parity is protected once. The parity on parity will put another level of protection to remove errors in parities.

Figure 9:
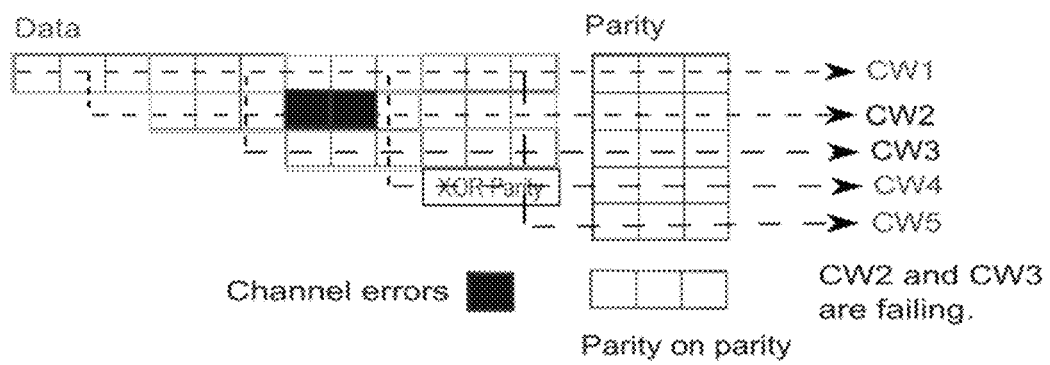
Figure 10:
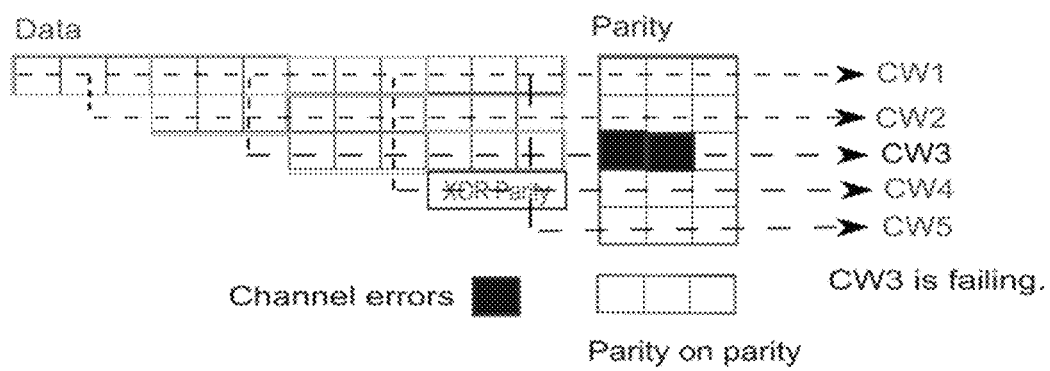

At step 608, the codewords are decoded and stuck error patterns are corrected. Step 608 may be performed by a decoder. The XOR may be used to correct stuck error patterns. For example, in FIG. 9, the intersection of two failing codewords (CW2 and CW3) may be corrected by using XOR parity as described below. Also, as shown in FIG. 10, the stuck pattern may also be corrected through XOR parity by making corrections in parity blocks. The stuck error patterns refer to locations or intersections at the presence of a channel error. In both FIGS. 9 and 10, the correction capability is assumed to be equal to 1 for illustrative purposes.

Figure 11:
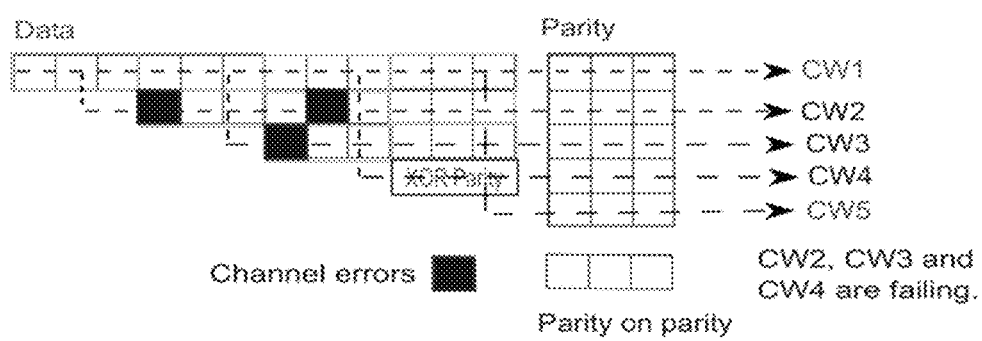
Figure 12:
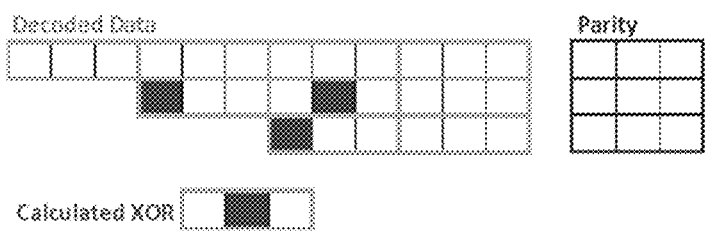
Figure 13:
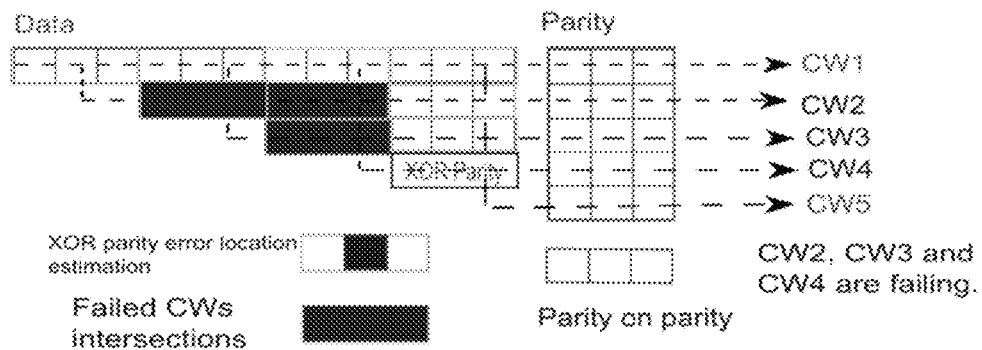

The stuck pattern shown in FIG. 11 may be corrected as followed. First, the XOR parity may be constructed/generated/calculated through the decoded data as shown in FIG. 12. The calculated XOR parity by the decoder may be compared to the XOR parity stored by the encoder to determine locations and/or intersections of errors based on the difference between the calculated XOR parity and the stored XOR parity. In this example, the calculated XOR parity and stored XOR parity differs at one location, which means that this is the possible error location (See FIG. 13). The intersection of all pairs of failed codewords can contain the error at the estimated location.

At failed error intersections, the flipping of the estimated bits can be attempted and regular decoding can be performed. In this example, flipping in the intersection of CW2 and CW3 will not lead to successful decoding. However, flipping the bit in the intersection of CW2 and CW4 will decode all codewords successfully.

In general, the value of I will be much larger than 3. The disclosed decoding through XOR parity can provide possible error locations better with large values of I and significantly reduce the number of flips for successful decoding. For example, let m error locations be provided through XOR parity and there are $F_I$ possible error location intersections. $2^m$ bit flips can be tried on those $F_I$ intersections to get the successfully decoded data. In general, the XOR parity can also be used to correct errors for the case when there are more than 3 row codewords failing.

Figure 14:
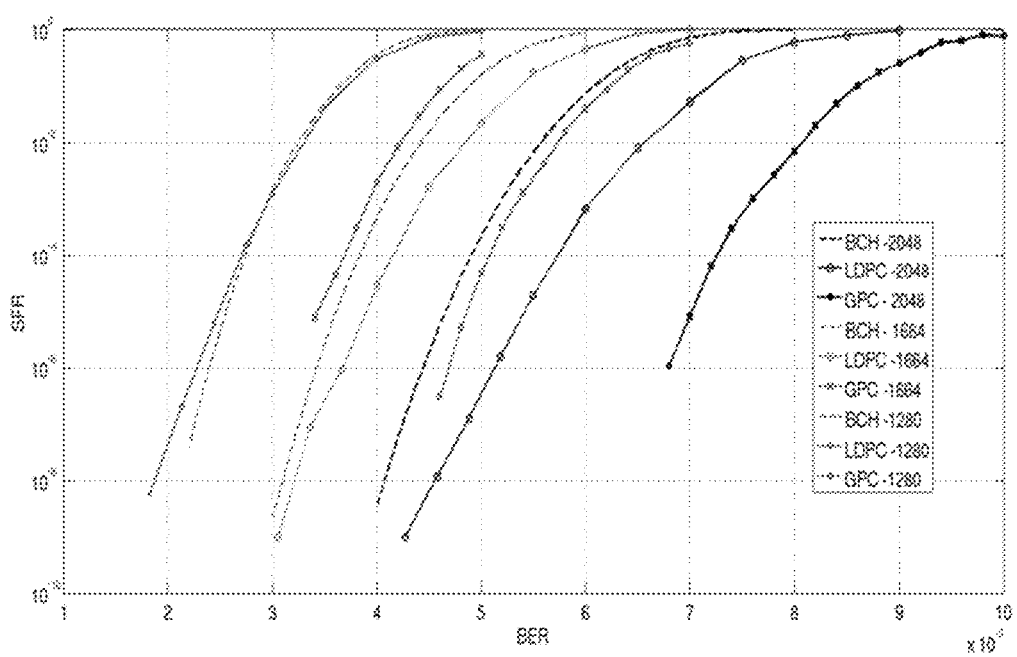
FIG. 14 is a graph depicting system performance in accordance with aspects of the invention.

FIG. 14 is a graph showing system performance for the GPC scheme at different code rates compared with LDC and BCH codes. In hard decision decoding, the GPC disclosed herein provides substantial performance gains.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:
1. A memory system, comprising:
an encoder suitable for:
arranging data in rows of blocks;
permuting the data in each single row of blocks and constructing row parities on the permuted data for the corresponding row of blocks to generate a corresponding codeword, of a plurality of codewords, one of which is generated for each row of blocks; and
combining, column-wise, a parity bit of the row parities of each of the plurality of codewords to generate combined parities; and
a decoder suitable for:
decoding the plurality of codewords to generate decoded codewords; and correcting stuck error patterns in one or more unsuccessfully decoded codewords, among the decoded codewords, based at least in part on one or more of the combined parities.

2. The memory system of claim 1, wherein the data in the rows of blocks are permuted such that each block is included in at least two rows.

3. The memory system of claim 1, wherein each block includes a same number of bits.

4. The memory system of claim 1, wherein the encoder is further suitable for generating an XOR parity and storing the XOR parity in at least one of the rows of blocks.

5. The memory system of claim 4, wherein the XOR parity is generated by taking an XOR of the data in a single select row of blocks and a predetermined number of the constructed row parities.

6. The memory system of claim 4, wherein the decoder is suitable for correcting stuck error patterns by:
constructing an XOR parity from the decoded codewords; and
determining a location of a stuck error pattern based on a difference between the XOR parity constructed by the decoder and the XOR parity generated by the encoder.

7. The memory system of claim 4, wherein the decoder is suitable for correcting stuck error patterns by:
determining an error location intersection of two of the one or more unsuccessfully decoded codewords; and
flipping a bit at the error location intersection.

8. A method, comprising:
arranging, with an encoder, data in rows of blocks;
permuting, with the encoder, the data in each single row of blocks and constructing row parities on the permuted data for the corresponding row of blocks to generate a codeword, of a plurality of codewords, one of which is generated for each row of blocks;
combining, column-wise, with the encoder, a parity bit of the row parities of each of the plurality of codewords to generate combined parities;
decoding, with a decoder, the plurality of codewords to generate decoded codewords; and
correcting, with the decoder, stuck error patterns in one or more unsuccessfully decoded codewords, among the decoded codewords, based at least in part on one or more of the combined parities.

9. The method of claim 8, wherein the data in the rows of blocks are permuted such that each block is included in at least two rows.

10. The method of claim 8, wherein each block includes a same number of bits.

11. The method of claim 8, further comprising generating, with the encoder, an XOR parity and storing the XOR parity in at least one of the rows of blocks.

12. The method of claim 11, wherein the XOR parity is generated by taking an XOR of the data in a single select row of blocks and a predetermined number of the constructed codeword parities.

13. The method of claim 11, wherein the correcting error patterns step further comprises:
constructing, with the decoder, an XOR parity from the decoded codewords; and
determining a location of a stuck error pattern based on a difference between the XOR parity constructed by the decoder and the XOR parity generated by the encoder.

14. The method of claim 11, wherein the correcting error patterns step includes:
determining, with the decoder, an error location intersection of two of the one or more unsuccessfully decoded codewords; and
flipping a bit at the error location intersection.

15. A memory device, comprising:
an encoder configured to:
arrange data in rows of blocks;
permute the data in each single row of blocks and construct row parities on the permuted data for the corresponding row of blocks to generate a codeword, of a plurality of codewords, one of which is generated for each row of blocks; and
combine, column-wise, a parity bit of the row parities each of the plurality of codewords to generate combined parities; and
a decoder configured to:
decode the plurality of codewords to generate decoded codewords; and
correct stuck error patterns in one or more unsuccessfully decoded codewords, among the decoded codewords, based at least in part on one or more of the combined parities.

16. The memory device of claim 15, wherein the encoder is further configured to generate an XOR parity and store the XOR parity in at least one of the rows of blocks.

17. The memory device of claim 16, wherein the XOR parity is generated by taking an XOR of the data in a single select row of blocks and a predetermined number of the constructed codeword parities.

18. The memory device of claim 17, wherein the decoder is further configured to correct stuck error patterns by:
constructing an XOR parity from the decoded codewords; and
determining a location of a stuck error pattern based on a difference between the XOR parity constructed by the decoder and the XOR parity generated by the encoder.

* * * * *